(12) United States Patent
Kim

(10) Patent No.: US 7,463,487 B2
(45) Date of Patent: Dec. 9, 2008

(54) COOLING APPARATUS FOR FLAT DISPLAY DEVICE

(75) Inventor: Hong Ki Kim, Daegu (KR)

(73) Assignee: LG Electronics Inc., Seoul (KR)

( * ) Notice: Subject to any disclaimer, the term of this patent is extended or adjusted under 35 U.S.C. 154(b) by 11 days.

(21) Appl. No.: 11/498,863

(22) Filed: Aug. 4, 2006

(65) Prior Publication Data

US 2007/0103863 A1    May 10, 2007

(30) Foreign Application Priority Data

Nov. 4, 2005   (KR) ...................... 10-2005-0105172
Nov. 4, 2005   (KR) ...................... 10-2005-0105174

(51) Int. Cl.
H05K 7/20     (2006.01)
F04D 5/00     (2006.01)
H04N 5/74     (2006.01)

(52) U.S. Cl. ........................ 361/715; 361/692; 361/695; 454/184; 345/60; 345/905; 415/53.1

(58) Field of Classification Search ......... 361/694–695; 415/53.1–53.3, 212.1; 454/184; 165/80.3, 165/104.33, 121–122; 345/60, 905; 348/748; 313/46; 349/161
See application file for complete search history.

(56) References Cited

U.S. PATENT DOCUMENTS

| | | | |
|---|---|---|---|
| 3,177,794 A * | 4/1965 | Laing | 454/121 |
| 5,038,577 A | 8/1991 | Stanford | 62/262 |
| 5,497,573 A | 3/1996 | Stadjuhar et al. | 40/564 |
| 5,735,137 A | 4/1998 | Kim | 62/410 |
| 5,787,717 A | 8/1998 | Bang | 62/89 |
| 5,788,569 A | 8/1998 | Lee | 454/233 |
| 5,788,570 A | 8/1998 | Cho | 454/233 |
| 5,807,170 A | 9/1998 | Lee | 454/233 |
| 5,869,919 A * | 2/1999 | Sato et al. | 313/17 |
| 6,511,291 B2 * | 1/2003 | Koochingchai | 415/229 |

(Continued)

FOREIGN PATENT DOCUMENTS

JP          2000124624 A  *  4/2000

(Continued)

OTHER PUBLICATIONS

Korean Office Action dated Dec. 11, 2006.

*Primary Examiner*—Jayprakash N Gandhi
*Assistant Examiner*—Robert J Hoffberg
(74) *Attorney, Agent, or Firm*—Ked & Associates, LLP

(57) ABSTRACT

There is provided a cooling apparatus for a flat display device. The cooling apparatus includes a flat display module, a front cover for protecting a front portion of the flat display module, a back cover for protecting a rear portion of the flat display module, an air inlet formed on a portion of the back cover to allow external air to be introduced into the back cover, an air outlet formed on another portion of the back cover and extending along a longitudinal length of the flat panel display module; a fan disposed inside the back cover and aligned with the air outlet formed on the back cover, and an air outlet channel formed in the back cover and aligned with the air outlet formed on the back cover, the air outlet having an effective exhaust area having a longitudinal length extending in a longitudinal direction of the flat display module.

15 Claims, 12 Drawing Sheets

U.S. PATENT DOCUMENTS

| | | | |
|---|---|---|---|
| 2003/0202880 A1* | 10/2003 | Koochingchai | 415/229 |
| 2004/0223299 A1 | 11/2004 | Ghosh | 361/687 |
| 2005/0056037 A1 | 3/2005 | Park et al. | 62/262 |
| 2005/0056038 A1 | 3/2005 | Park et al. | 62/262 |
| 2005/0056039 A1 | 3/2005 | Kim et al. | 62/262 |
| 2005/0105012 A1* | 5/2005 | Kim et al. | 349/58 |
| 2005/0168942 A1 | 8/2005 | Steinbrecher | 361/690 |
| 2005/0284170 A1* | 12/2005 | Lee et al. | 62/419 |
| 2006/0082271 A1* | 4/2006 | Lee et al. | 313/35 |
| 2006/0164804 A1* | 7/2006 | Kim et al. | 361/688 |
| 2006/0199514 A1* | 9/2006 | Kimura | 454/237 |
| 2007/0103863 A1 | 5/2007 | Kim | 361/687 |
| 2007/0103864 A1* | 5/2007 | Kim | 361/687 |
| 2007/0103865 A1* | 5/2007 | Kim | 361/694 |
| 2007/0103866 A1* | 5/2007 | Park | 361/695 |
| 2007/0103909 A1* | 5/2007 | Park | 362/294 |

FOREIGN PATENT DOCUMENTS

| | | |
|---|---|---|
| JP | 2000-156581 | 6/2000 |
| JP | 2000307281 A * | 11/2000 |
| JP | 2001-102681 | 4/2001 |
| KR | 2005/0047624 | 5/2005 |

* cited by examiner

COOLING APPARATUS FOR FLAT DISPLAY DEVICE

BACKGROUND OF THE INVENTION

1. Field of the Invention

The present invention relates to a flat display device, and more particularly, a cooling apparatus for a flat display device, which can be operated with a low noise while quickly dissipating internal heat to an external side.

2. Description of the Related Art

Unlike a cathode ray tube (CRT), a flat display uses a driving circuit arranged in a matrix pattern to differently excite pixels and thus realize an image. Recently, the flat display device has been widely used as it has advantageous in that it takes up a relatively small space. A variety of flat display modules such as a liquid crystal display (LCD), a field emission display (FED), a plasma display panel (PDP), and an electro-luminescence (EL) have been applied to the flat display device.

The flat display device using the flat display module is reduced in a thickness as compared with the CRT. However, since a large number of heat-generating components have to be incorporated in a narrow space of the display device, the heat, which is generated by the heat-generating components in the flat display device during the operation of the flat display module, must be effectively dissipated to an external side.

Particularly, in the case of the PDP, since the image is realized by electric discharge of discharge gas, large amount of heat is generated. Therefore, if the large amount of heat is not quickly dissipated, the display device may malfunction. Needless to say, in the case of other types of flat display devices, the heat dissipation performance is very important fact determining the quality thereof.

In order to locally dissipate the heat, a heat sink is attached on a rear surface of a specific component generating a large amount of heat to cool the specific component. Furthermore, in order to generally dissipate the heat, a plurality of holes is formed on a cover of the flat display device so that cool air can pass through the holes. However, although the cooling effect for the specific component can be expected, the heat is not effectively dissipated to the external side. Therefore, the flat display device cannot be stably operated. That is, the internal temperature of the flat display device increases to deteriorate the performance of the flat display device.

In order to solve the above problem, an axial fan is installed on a rear center portion of a back cover in a direction perpendicular to a direction where the display device is formed. The axial fan forcedly exhausts the internal high temperature air of the flat display device to the external side through a rear side of the display device. In this case, although the heat collected in the display device can be effectively discharged to the external side, excessive noise is generated during the operation of the axial fan. Furthermore, a gap of ten or more centimeters must be provided between the rear surface of the display device and the wall so that the air can be exhausted. In addition, due to a gap between the axial fan and the flat display module and a thickness of the axial fan, an overall thickness of the flat display device increases.

Furthermore, a plurality of holes through which the air is exhausted and introduced are formed on the back cover. The holes of the back cover deteriorate strength of the back cover. Therefore, the back cover must be enough thick. In this case, the manufacturing cost increases.

SUMMARY OF THE INVENTION

Accordingly, the present invention is directed to a cooling apparatus for a flat display device that substantially obviates one or more problems due to limitations and disadvantages of the related art.

An object of the present invention is to provide a cooling apparatus for a flat display device, which is designed to make the flat display device slimmer and effectively dissipate internal heat of the flat display device.

Another object of the present invention is to provide a cooling apparatus for a flat display device, which can minimize noise and be manufactured with low costs.

Still another object of the present invention is to provide a cooling apparatus for a flat display device, which can minimize noise and improve heat dissipation efficiency by allowing internal air of the flat display device to be exhausted by natural convection.

Still yet another object of the present invention is to provide a cooling apparatus for a flat display device, which can improve a degree of installation free of the display device by improving an airflow direction in the flat display device.

Still yet another object of the present invention is to provide a cooling apparatus for a flat display device, which can enhance strength of a back cover by improving location and structure of holes formed on the back cover.

Still yet another object of the present invention is to provide a cooling apparatus for a flat display device, which can improve an operation reliability of the flat display device.

Still yet another object of the present invention is to provide a cooling apparatus for a flat display device, which can provide high heat dissipation efficiency even for a large-sized flat display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a cooling apparatus for a flat display device, including: a flat display module; a front cover for protecting a front portion of the flat display module; a back cover for protecting a rear portion of the flat display module; an air inlet formed on a portion of the back cover to allow external air to be introduced into the back cover; an air outlet formed on another portion of the back cover and extending along a longitudinal length of the flat panel display module; a fan disposed inside the back cover and aligned with the air outlet formed on the back cover; and an air outlet channel formed in the back cover and aligned with the air outlet formed on the back cover, the air outlet having an effective exhaust area having a longitudinal length extending in a longitudinal direction of the flat display module.

In another aspect of the present invention, there is provided a cooling apparatus for a flat display device, including: a flat display module; a cover for receiving and protecting the flat display module; an air inlet formed on a portion of the cover to allow external air to be introduced into the back cover; an air outlet formed on another portion of the cover; and a fan disposed inside the cover and aligned with the air outlet, wherein an air outlet channel formed in the cover and aligned with the air outlet formed on the cover, the air outlet having an effective exhaust area having a longitudinal length extending in a longitudinal direction of the flat display module.

In still another aspect of the present invention, there is provided a cooling apparatus for a flat display device, including: a flat display module; a cover supporting the flat display module; an air inlet formed on the cover to allow external air to be introduced into the case; and a plurality of fans aligned in series in the cover to exhaust internal hot air generated by the flat display module to an external side through a frame portion of the cover.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1:
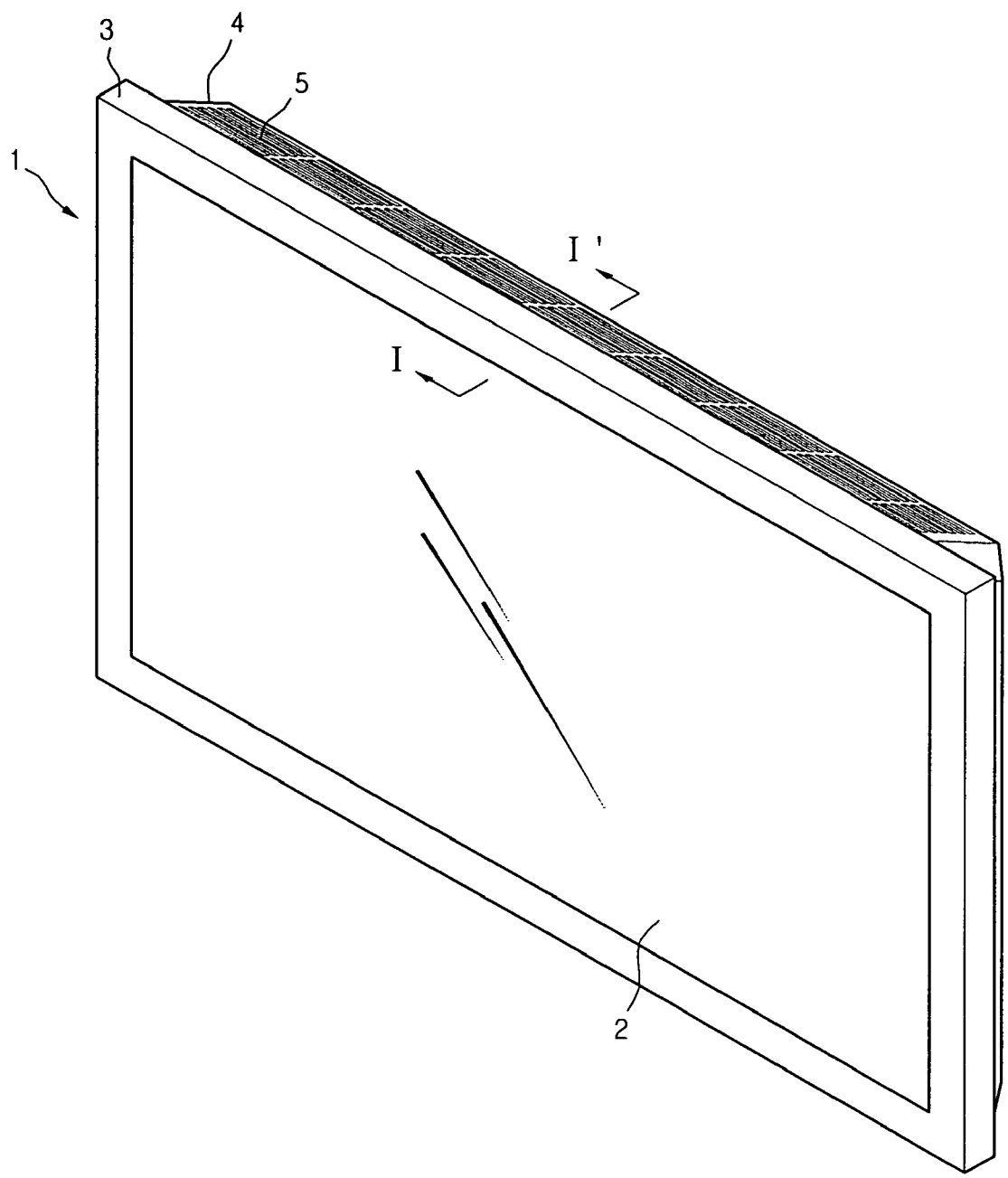
FIG. 1 is a perspective view of a flat display device having a cooling apparatus according to an embodiment of the present invention.

FIG. 1 is a perspective view of a flat display device according to an embodiment of the present invention.

Referring to FIG. 1, a flat display device 1 of this embodiment includes a flat display module 2, a front cover 3 for supporting and protecting a front portion of the flat display module 2, and a back cover 4 for supporting and protecting a rear portion of the flat display module 2. An air outlet 5 through which internal hot air of the flat display device 1 is exhausted, is formed on an upper peripheral of the back cover 4. The air outlet 5 has a plurality of slits. The slits are arranged not to deteriorate strength of the back cover 4. That is, the air outlet 5 means a portion provided in the back cover 4, of which the inner area has the slits in a type of aggregation.

The flat display module 2 may be selected from the group consisting of an LCD, an FED, a PDP, and an EL. Preferably, the flat display module 2 may be provided with the PDP generating high temperature heat.

The front and back covers 3 and 4 define a space for receiving the flat display module 2 and protect components disposed in the space. The front and back covers 3 and 4 are independent parts that are assembled with each other. However, the present invention is not limited to this case. For example, the front and rear covers 3 and 4 may be integrated as a single body as far as they can protect the front and rear portions of the display device. There is a predetermined gap between a heat generating component provided on a surface of the flat display module 2 and an inner surface of the back cover 4 so that air flows through the gap to cool the heat generating component and is then exhausted through the air outlet 5.

The operation of a cooling apparatus of the present invention will now be described with reference to the above flat display device.

When the flat display device 1 operates, a large amount of heat is generated in the flat display module 2. At this point, the hot air generated from the heat generating component disposed on the rear surface of the flat display module 2 is cooled by the incoming air. Then, the hot air flows upward and is then exhausted through the air outlet 5. This is the natural convection for exhausting the hot air out of the flat display device, thereby improving the cooling efficiency. At this point, it is more preferable to allow outer air to be introduced through an overall area of the bottom portion of the flat display device 1 and exhausted via an overall area of the rear portion of the display device.

Furthermore, the air outlet 5 is provided on an inclined portion of the back cover frame so that the hot air can be exhausted upward and thus the hot air can more effectively flow.

In addition, since the front surface of the flat display module 2 is exposed to the external side, the heat generated from the front portion of the display module 2 can be quickly dissipated by the natural convention of the outer air.

Figure 2:
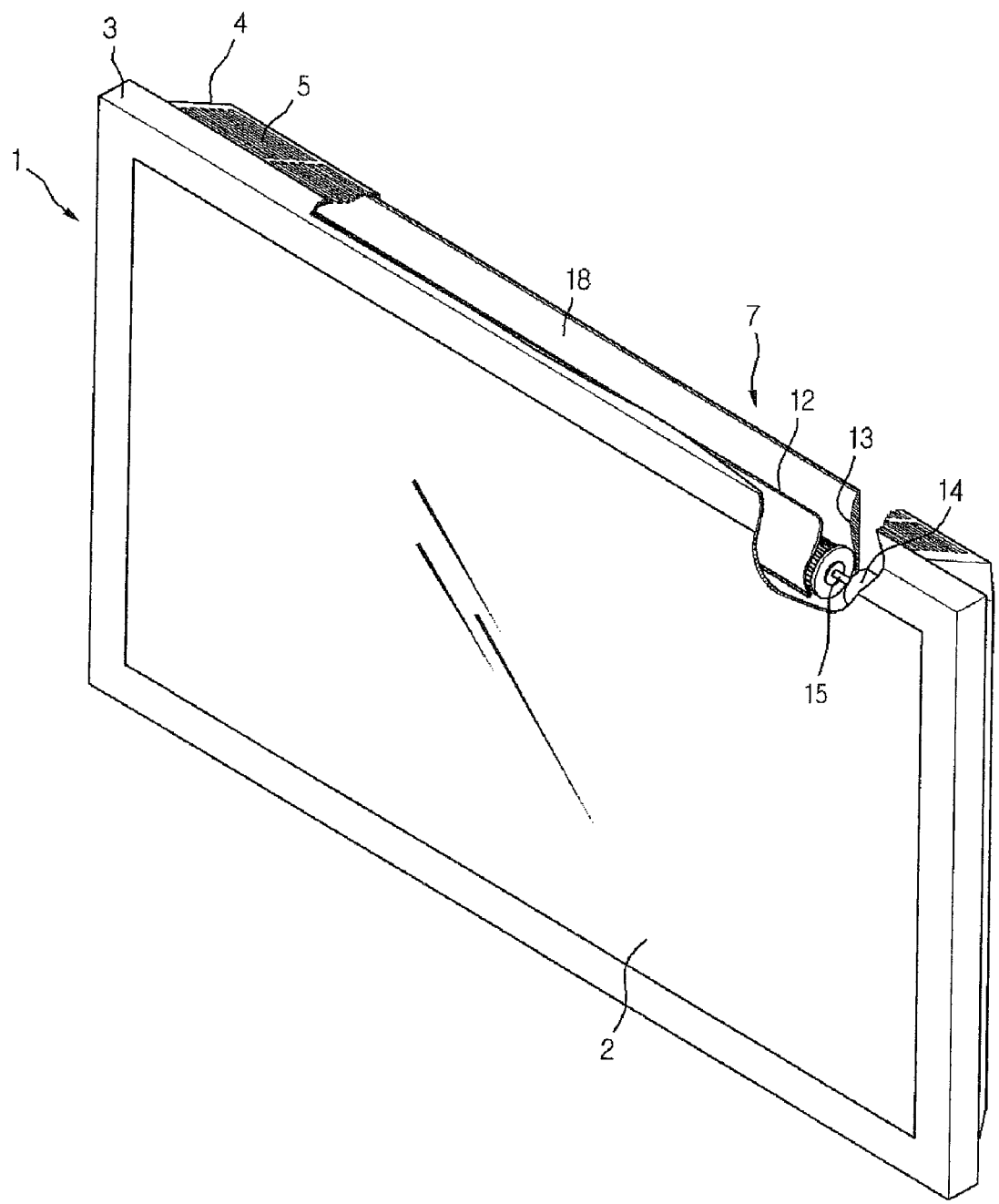
FIG. 2 is a partially broken perspective view of the flat panel display of FIG. 1.

FIG. 2 is a partially broken perspective view of the flat panel display of FIG. 1.

Referring to FIG. 2, a cross-flow fan 7 is installed in an inner-upper portion of the flat display device 1 in a longitudinal direction of the flat display device 1. By the cross-flow fan 7, the top surface of the back cover 4 provides a gap through which the internal hot air is exhausted to the external side. Since the hot air can be exhausted through the top surface of the back cover 4, the air exhaust can be more effectively realized to reduce airflow resistance and airflow noise, thereby enhancing the heat dissipation efficiency of the flat display device.

Describing the cross-flow fan 7 in more detail, the cross-flow fan 7 includes an impeller (10 of FIG. 3) disposed in the longitudinal direction of the back cover 4 and a circular plate for dividing the impeller 10 by a predetermined interval along the longitudinal direction of the impeller 10 and enhancing strength of the impeller. The cross-flow fan 7 is further includes a driving shaft 15 connected to a motor 14. A rotational force of the motor 14 is transferred to the cross-flow fan via the driving shaft 15.

The impeller 10 is disposed in a housing 18 to guide the airflow when the impeller 10 rotates. The housing 18 includes a scroll 12 disposed in front of the impeller 10 and spaced apart from the impeller 10 and a stabilizer 13 disposed in rear of the impeller 10 and spaced apart from the impeller 10. The impeller 10 rotates clockwise in the drawing.

Figure 3:
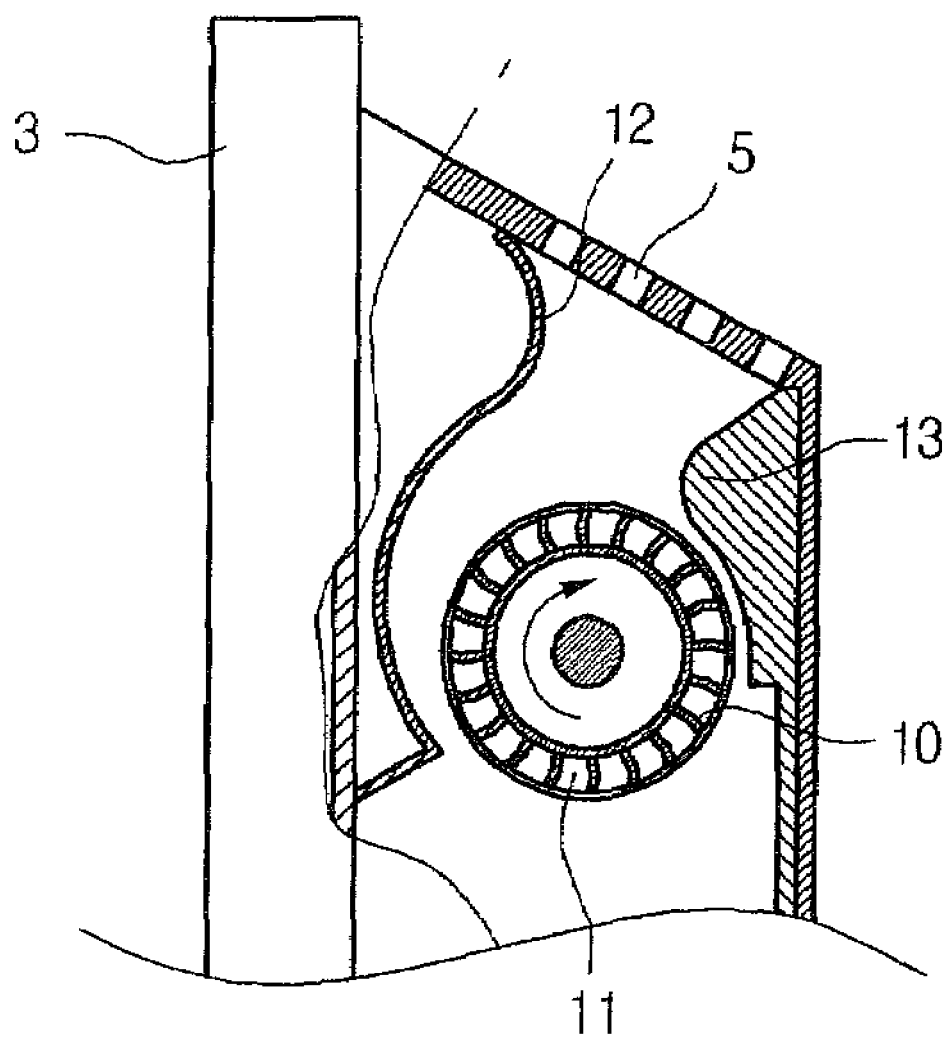
FIG. 3 is a sectional view taken along line I-I'.

FIG. 3 is a sectional view taken along line I-I'.

When the cross-flow fan 7 operates, the internal air of the back cover 4 flows upward and is then exhausted to the external side by being guided by the scroll 12.

As described above, since the cross-flow fan 7 extends fully relative to the overall longitudinal length of the top surface of the back cover 4, a relatively large amount of air can be exhausted. Needless to say, when there is no need to dispose the cross-flow fan 7 relative to the overall longitudinal length in case of the screen size of the display device is small, the lengths of the air outlet 5 and the cross-flow fan 7 may be reduced.

As described above, since the air exhaust area increases as compared to that of the prior art, the airflow resistance and airflow noise can be reduced. Furthermore, since the hot air is exhausted through the top surface of the back cover 4, there is no need to provide a gap between a wall on which the display device is installed and a rear surface of the back cover 4. Therefore, the flat panel display device can be closely installed on the wall, thereby taking up a relatively small in-house space.

Figure 4:
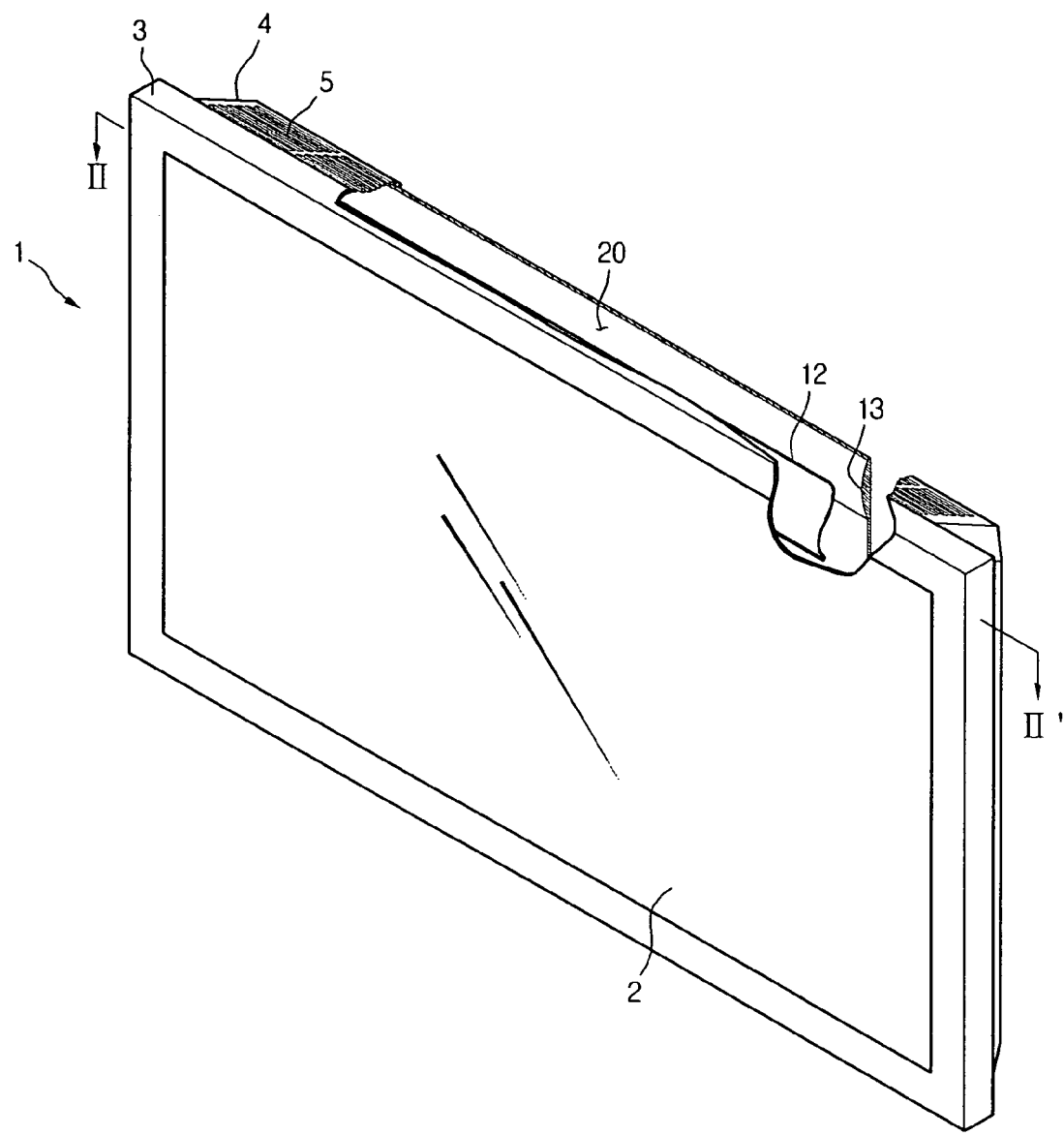
FIG. 4 is a perspective view of the flat display device of FIG. 2, in which the impeller and the motor are omitted.
Figure 5:
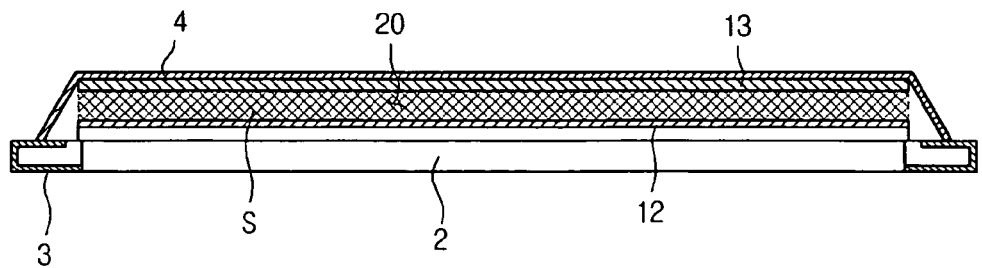
FIG. 5 is a sectional view taken along line II-II'.

FIG. 4 is a perspective view of the flat display device of FIG. 2, in which the impeller and the motor are omitted and FIG. 5 is a sectional view taken along line II-II'.

The operation of the cooling apparatus of the flat display device of the present invention will now be described. A rectangular airflow channel 20 is defined between the stabilizer 13 and the scroll 12. The cross-flow fan 7 is installed in the air flow channel 20. A cross-sectional area of the airflow channel 20 provides an effective exhausting area "S" for exhausting the air by the cross-flow fan 7.

In this embodiment, since the effective exhausting area "S" is almost identical to an area of the top surface of the back cover 4, the internal hot air of the flat display device can be quickly and effectively exhausted to the external side. That is, as the effective exhaust area increases, the internal hot air can be more quickly exhausted and the noise can be further reduced, thereby further improving the heat dissipation efficiency.

In addition, when the effective exhaust area "S" increases, an amount of air passing through the inside of the display device increases to enhance the cooling efficiency. Therefore, there is no need to form additional air inlet and outlet holes on the rear surface of the back cover 4. Since there is no air inlet and outlet holes on the back cover, the strength of the back cover is not deteriorated. Therefore, there is no need to make the back cover 4 using a high strength steel plate, thereby reducing the manufacturing cost.

As the screen size of the display device increases, the effective exhaust area "S" formed on the top surface of the back cover 4 can further increase. Therefore, even though an amount of heat generated in the flat display device having the large-sized screen increases, the heat can be effectively dissipated only if increase the size of the effective exhaustive area "S". Furthermore, since the cross-flow fan 7 is installed along the overall longitudinal length of the display device without interfering other components, the heat dissipation efficiency can be further improved.

The effective exhaust area "S" formed on the top surface of the back cover 4 is defined by a rectangular area defined by parallel longitudinal sides and parallel lateral sides of the display device. Namely, the effective exhaust area "S" is defined by a first edge provided in a lengthwise direction of the flat display device and a second edge provided in a perpendicular direction, namely widthwise direction of the flat display device, to the lengthwise direction of the flat display device. Of course, the first edge and second edge have a parallel two lines, having a shape of a rectangle. That is, since the effective exhaust area "S" is almost identical to that of the top surface of the back cover 4, the heat generated in the display device can be sufficiently dissipated to the external side through the effective exhaust area "S".

Figure 6:
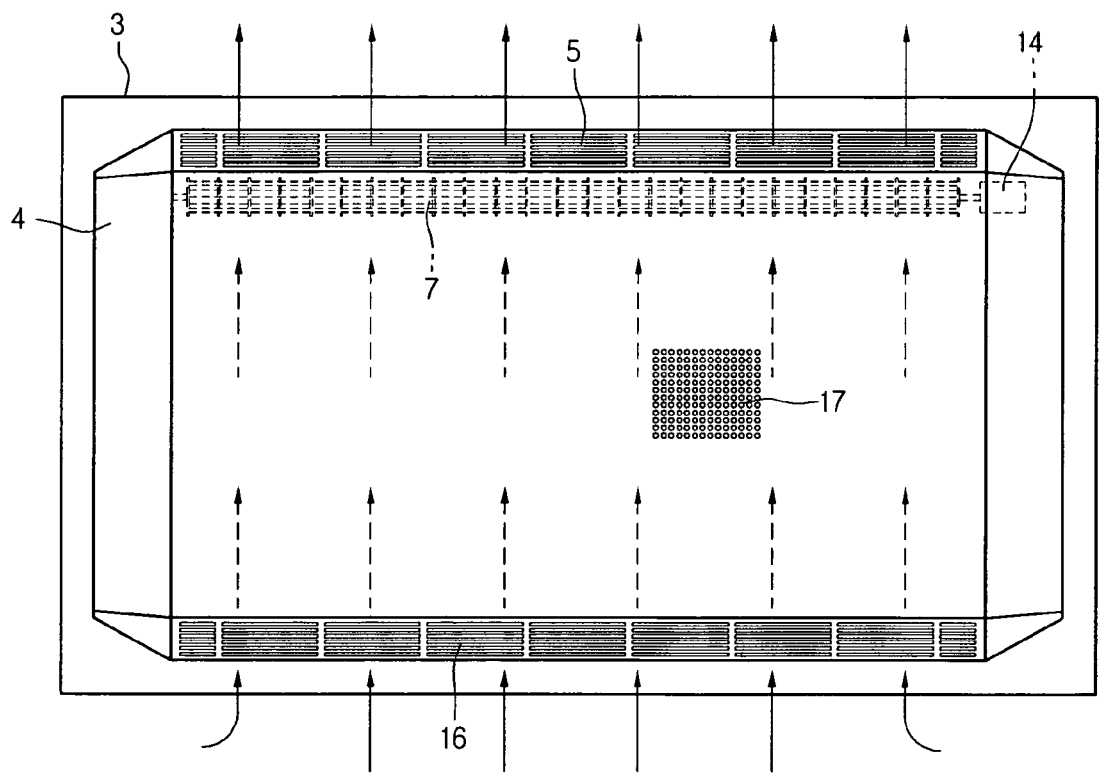
FIG. 6 is a rear view of the flat display device of FIG. 1.

FIG. 6 is a rear view of the flat display device of FIG. 1.

Referring to FIG. 6, the back cover 4 is further provided with a lower air inlet 16 and a rear air inlet 17.

The lower air inlet 16 is formed on an inclined portion of the lower peripheral of the back cover 4 to introduce external cool air into the flat display device. The cool air introduced through the lower air inlet compensates for the hot air exhausted through the air outlet 5. That is, the cool air introduce compensates for a negative pressure generated by the natural convection and a negative pressure generated by the air exhausted through the air outlet 5.

The cool air introduced through the lower air inlet 16 cools the components provided on the rear surface of the flat display module 2 and is then exhausted through the air outlet 5 via the cross-flow fan 7.

The lower air inlet 16 is preferably formed along the overall longitudinal length of the lower peripheral of the back cover 4 so that the components can be uniformly cooled. Arrows in the drawing indicates the airflow direction.

The cross-flow fan 7 is formed along the overall longitudinal length of the top surface of the back cover 4 and the effective exhaust area S is formed throughout the overall area of the top surface of the back cover 4. Therefore, the cool air introduced through the lower air inlet 16 flows upward, in the course of which the components is cooled, and is then exhausted through the air outlet. If the length of the cross-flow fan 7 is reduced, the heat dissipation effect at the corner sides of the flat display device may be reduced. Nevertheless, since the effective exhaust area "S" is large enough, the heat dissipation efficiency can be still improved.

Some of the components generate high temperature heat (i.e., a power unit) and some of the components (i.e., tape carrier package chip (TCP)) require a low temperature condition.

In order to meet the operational condition for each component, it is preferable that the components which require the thermal stability are disposed close to the lower air inlet 16 so that they can be quickly cooled by the cool air introduced. In addition, the components generating a large amount of heat is preferably disposed close to the cross-flow fan 7 so that the heat generated by the components can be quickly dissipated without affecting on other circuits.

The rear air inlet 17 is provided for the components that cannot be changed their installing location. That is, the rear air inlet 17 is formed on a portion of the back cover 4 corresponding to a specific portion of the flat display module 2 where the heat generation components are disposed. Therefore, the heat generation components disposed corresponding to the rear air inlet 17 can be quickly cooled by the cool air introduced through the rear air inlet 17. The air inlet 17 is not a indispensable component, therefore, if the installing location of the heat generation components can be changed, the rear air intake opening components may be omitted. That is, the heat generation components may be adjusted in their installing location to be closer to the cross-flow fan 7 or the lower air inlet 16.

As described above, since the cross-flow fan can be disposed along the overall length of the peripheral of the back cover 4, the internal hot air of the back cover can be quickly exhausted, thereby improving the heat dissipation efficiency and operational reliability of the flat display device.

Second Embodiment

Figure 7:
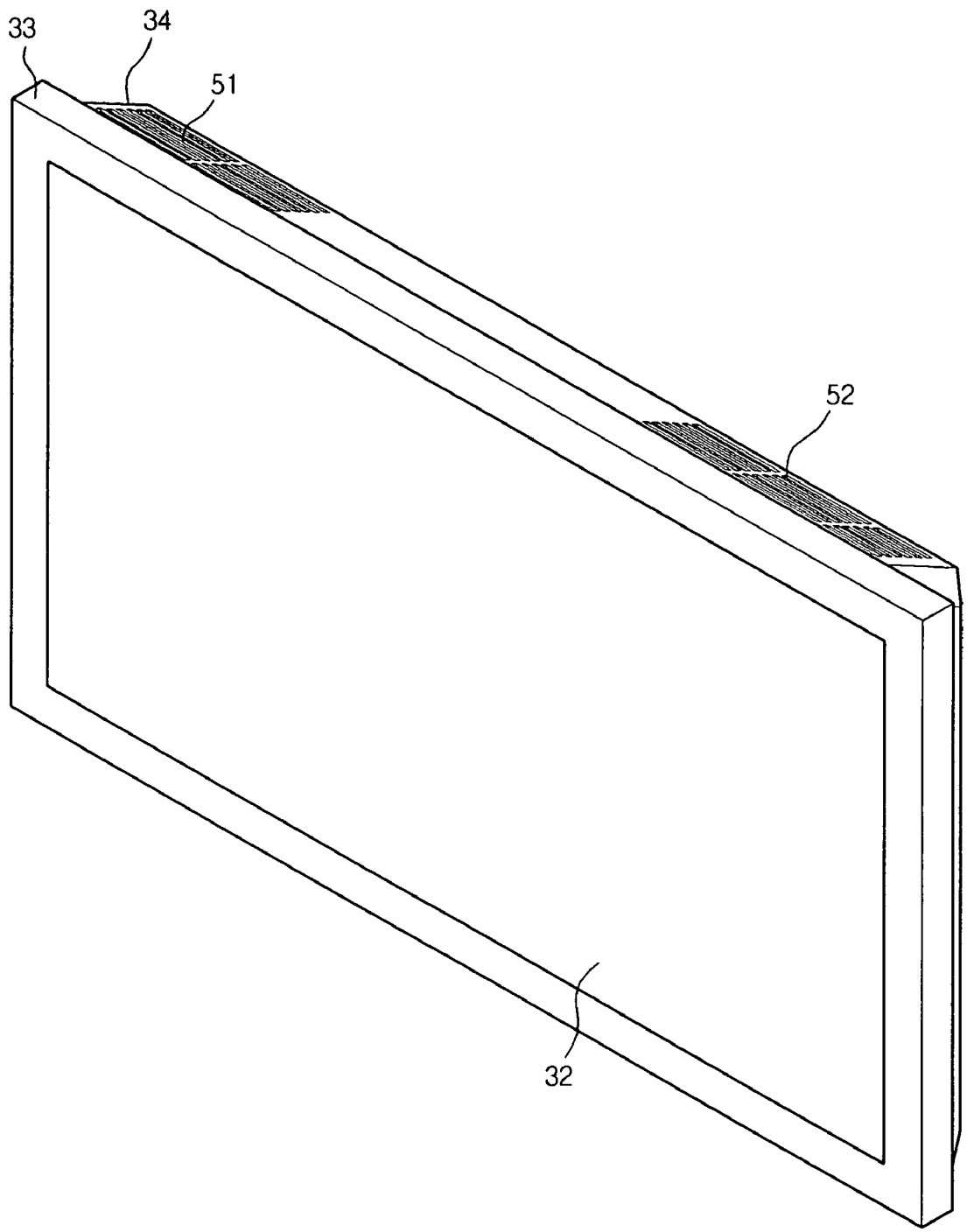
FIG. 7 is a perspective view of a flat display device having an cooling apparatus according to another embodiment of the present invention.

FIG. 7 is a perspective view of a flat display device according to another embodiment of the present invention. The flat display device of this embodiment is similar to that of FIG. 1. Therefore, only the different portion will be described hereinafter.

Referring to FIG. 7, a flat display device of this embodiment includes a flat display module 32, a front cover 33 for supporting and protecting a front portion of the flat display module 32, and a back cover 34 for supporting and protecting a rear portion of the flat display module 32. Left and right air outlets 51 and 52 through which internal hot air of the flat display device is exhausted are formed on a top surface of the back cover 34.

Since the air outlets 51 and 52 are formed on the right and left sides of the top surface of the back cover 34, the cooling efficiency for both sides of the flat display device can be more improved.

Figure 8:
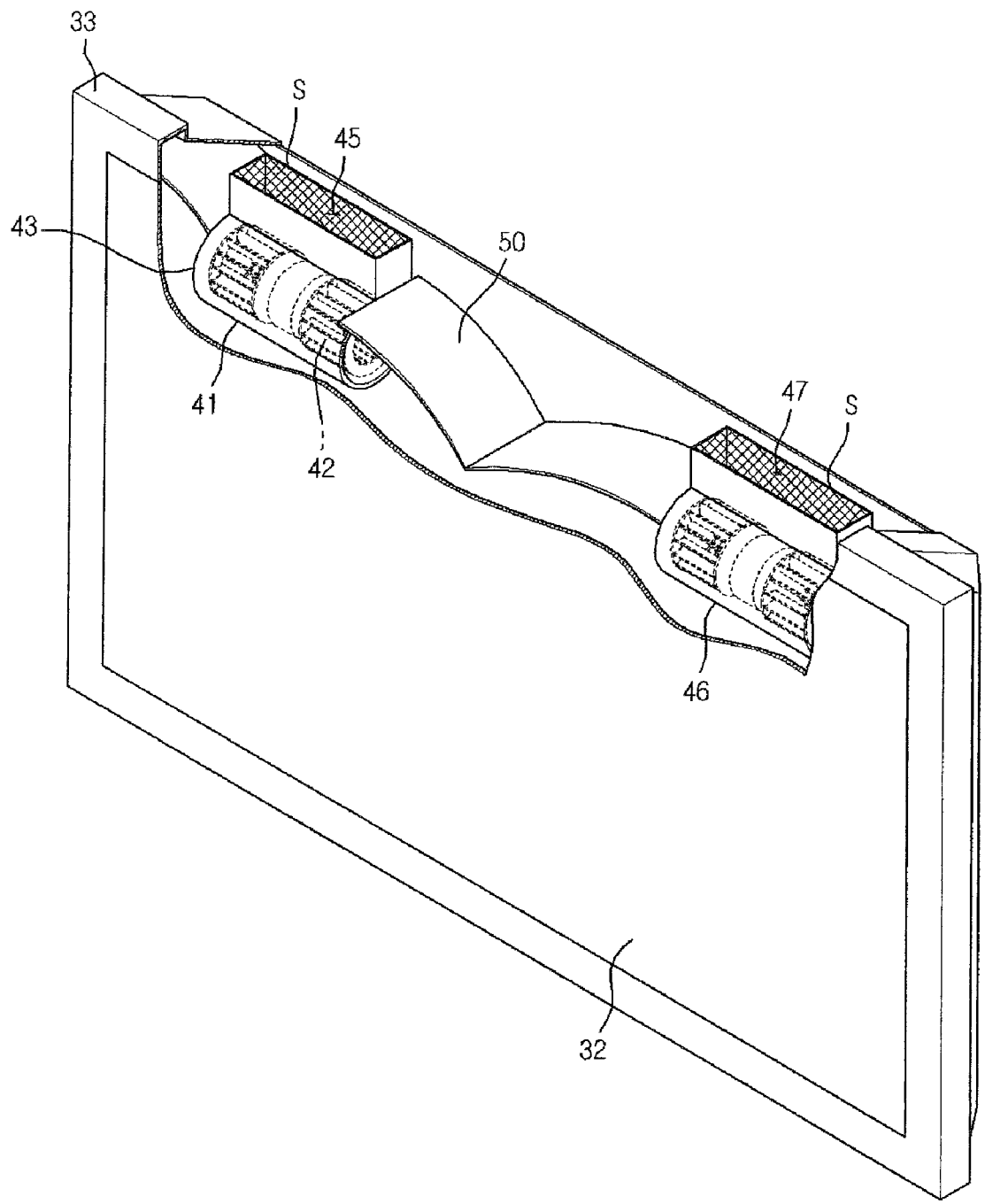
FIG. 8 is a partly broken perspective view of the flat display device of FIG. 7.

FIG. 8 is a partly broken perspective view of the flat display device of FIG. 7, in which an upper potion of the flat display device is broken away.

Referring to FIG. 8, a left sirocco fan 41 is disposed inside the back cover 34 and aligned with the left air outlet 51 and a right sirocco fan 46 is disposed inside the back cover 34 and aligned with the right air outlet 52. The internal hot air is exhausted through the left and right air outlets 51 and 52 by the left and right sirocco fans 41 and 46.

Since the left and right sirocco fans 41 and 46 are identical in a structure, only the left sirocco fan 41 will be described hereinafter.

The left sirocco fan 41 is a bi-directional air intake fan. The left sirocco fan 41 includes a housing 43 opposite ends of which are opened and an impeller 42 disposed in the housing 43. In order to simplify the structure of the sirocco fan 41, a motor 42 is disposed on a middle portion of the impeller 42. The air introduced through the opposite ends of the housing 43 is directed upward and exhausted through a right exhaust opening 45 having a rectangular effective exhaust area "S". Then, the air is exhausted to the external side through the right air outlet 51.

In order to effectively guide the air introduced through an inlet side of the sirocco fans 41 and 46, an airflow guide 50 is disposed between the sirocco fans 41 and 46. The airflow guide 50 is curved downward from the upper sides of the adjacent ends of the sirocco fans 41 and 46. The airflow guide functions to guide the cool air introduced into the display device to the sirocco fans as well as prevent the backflow of the air exhausted through the exhaust openings 45 and 47.

Figure 9:
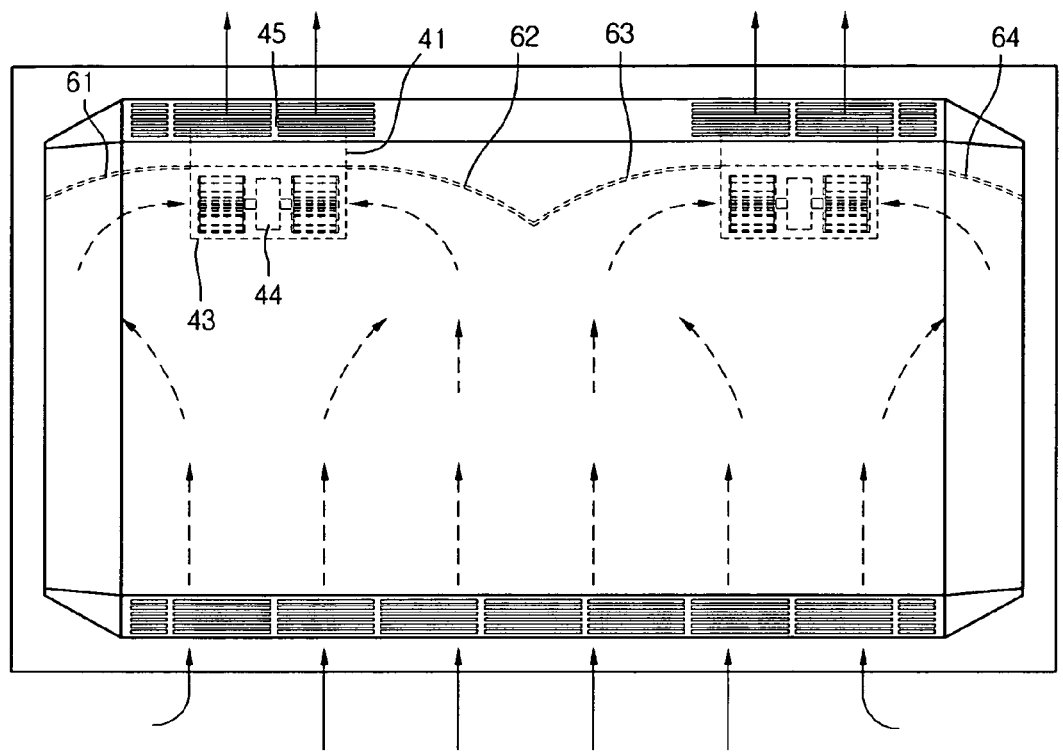
FIG. 9 is a rear view of the flat display device of FIG. 7.

FIG. 9 is a rear view of the flat display device of FIG. 7.

The cool air introduced through the lower air inlet cools the components provided on the rear surface of the flat display module 32 and is then introduced into the sirocco fans 41 and 46 by being guided by the airflow guide 50. At this point, the airflow guide 50 includes first through fourth airflow guide portions 61 through 64. Each airflow guide portion is curved downward from a top of the housing, thereby effectively guiding the air to the opposite ends of the housing 43.

The air introduced into the sirocco fans 41 and 46 through the opposite ends is exhausted to the external side through the exhaust opening 45 and the air outlet 51 by the impellers 42.

Since the effective exhaust area S is defined along the longitudinal length of the flat display device, the airflow resistance and the airflow noise can be reduced.

Since the airflow cannot be effectively realized at portions right under the sirocco fans 41 and 46, the cooling may not be effective at the portions right under the sirocco fans 41 and 46. To solve this problem, rear air intake openings identical to the rear air intake opening 17 of FIG. 6 may be further formed on the back cover 4.

In this embodiment, although only two sirocco fans are provided, the present invention is not limited to this. The number of sirocco fans may vary according to the size of the flat display device. As described above, since the overall area of the top surface of the back cover may be the effective air exhaust area, the heat dissipation efficiency can be further improved.

In addition, although the sirocco fan is the bi-directional air intake fan, the present invention is not limited to this. That is, the sirocco fan may be a one-way air intake fan where the motor is installed on one end of the impeller to direct the air in a predetermined direction. In this case, it is preferable that two or more sirocco fans are arranged in series to increase the hot air exhaust space. Likewise, the airflow resistance and airflow noise can be also reduced.

Meanwhile, although the effective exhaust area is defined in the rectangular shape, the shape of the effective exhaust area may vary according to a shape of the outlet of the fan. For example, the effective exhaust area may be formed in a trapezoidal shape.

Third Embodiment

Figure 10:
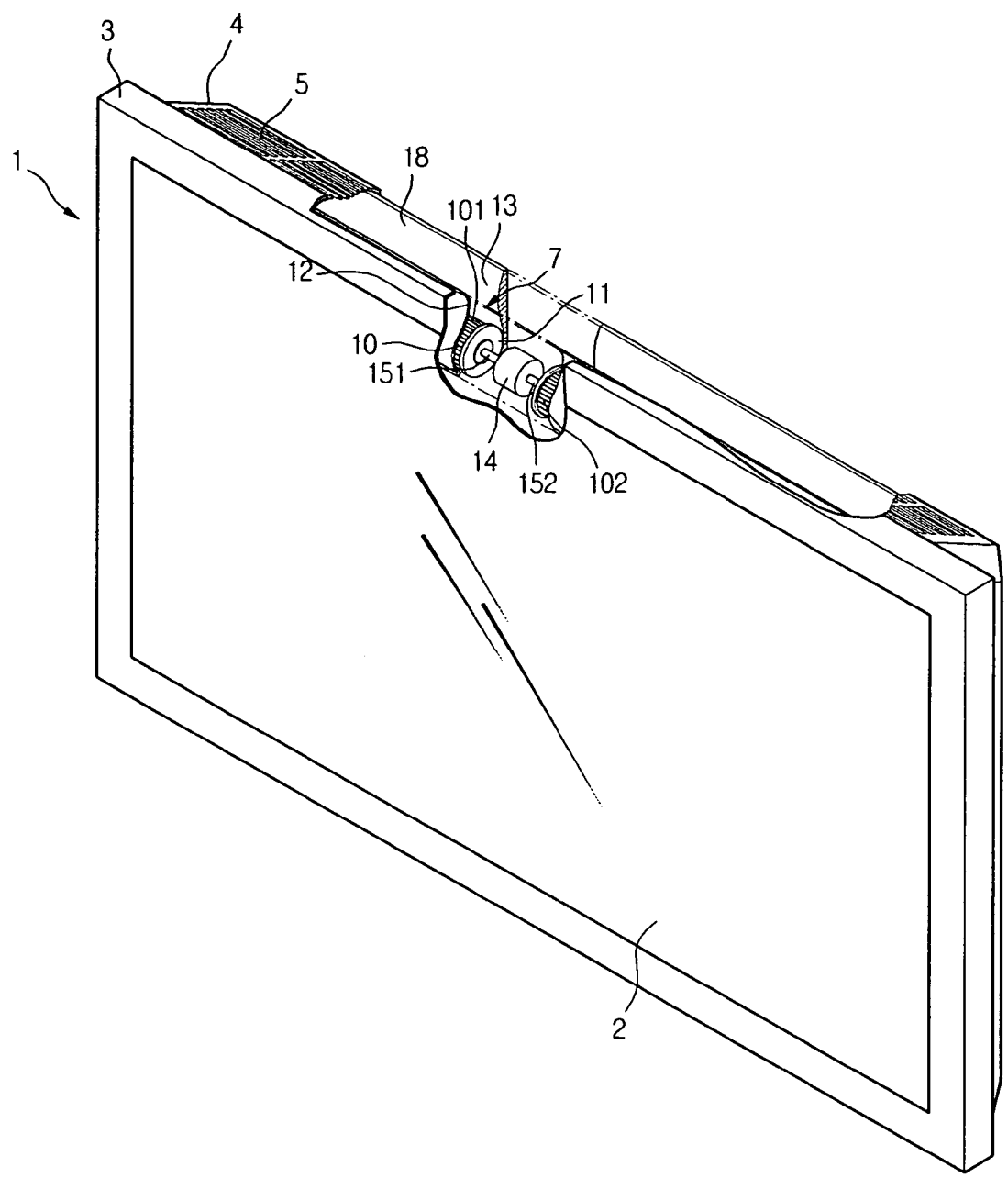
FIG. 10 is a perspective view of a flat display device having a cooling apparatus according to another embodiment of the present invention.

FIG. 10 is a perspective view of a flat display device having a cooling apparatus according to another embodiment of the present invention. The flat display device of this embodiment is similar to that of FIG. 1. Therefore, only the different portion will be described hereinafter.

Referring to FIG. 10, a cross-flow fan 7 of this embodiment is different from that of FIG. 2. That is, the cross-flow fan 7 of this embodiment includes a motor 14 installed on a middle portion. Driving shafts 151 and 152 extend from opposite ends of the motor 14 and are connected to an impeller unit 10.

The impeller unit 10 includes left and right impellers 101 and 102. Therefore, the vibration or unstable operation, which may be caused when the impeller unit 10 is formed in a long single impeller, can be prevented.

The left and right impellers 101 and 102 are connected to the single motor 14 by the left and right driving shafts 151 and 152, respectively. Therefore, when the motor 14 operates, the left and right impellers 101 and 102 can simultaneously rotate.

As described above, since the impeller unit 10 is divided into the left and right impellers 101 and 102 each having a relatively short length, it can stably operated without generating the vibration and noise. That is, even when the vibration of the motor 14 is transferred to the impellers 101 and 102, the vibration is not excessively magnified and thus the generation of the vibration and noise can be relatively reduced, thereby improving the operational reliability of the cross-flow fan 7.

Furthermore, since the left and right impellers 101 and 102 can be supported by independent supporting structures, the structure reliability of the cross-flow fan 7 can be improved. That is, when the impeller unit 10 is a single long impeller, one end of the impeller is connected to the driving shaft of the motor while the other is supported on a extra supporting structure. In this case, the supporting structure of the impeller unit is unstable to prevent the vibration of the fan.

However, in this embodiment, since the impeller unit 10 of this embodiment is divided into the left and right short impellers with same length and the left and right short impellers are supported by the independent supporting structures, the overall operation of the cooling apparatus can be stably realized. Even in this case, since only one motor is used, the cost does not increase.

Furthermore, since the motor is disposed between the impellers 101 and 102, the impellers 101 and 102 can extend to reach left and right inner ends of the back cover 4. That is, when the impeller unit is the single impeller one end of which is connected to the motor, the impeller cannot extend to reach one inner end of the back case due to the motor. However, in this embodiment, since the motor is disposed between the impellers 101 and 102, the impellers 101 and 102 can extend to reach left and right inner ends of the back cover 4. Therefore, the components disposed at both inner side ends of the display device can be effectively cooled.

In this embodiment, a single scroll 12 is provided for both the left and right impellers 101 and 102 and a single stabilizer 12 is also provided for both the left and right impellers 101 and 102. However, the present invention is not limited to this case. For example, separated scrolls may be provided for the left and right impellers 101 and 102, respectively. Likewise, separated stabilizers may be provided for the left and right impellers 101 and 102, respectively.

Alternatively, the left and right impellers 101 and 102 may be different in a structure from each other.

Figure 11:
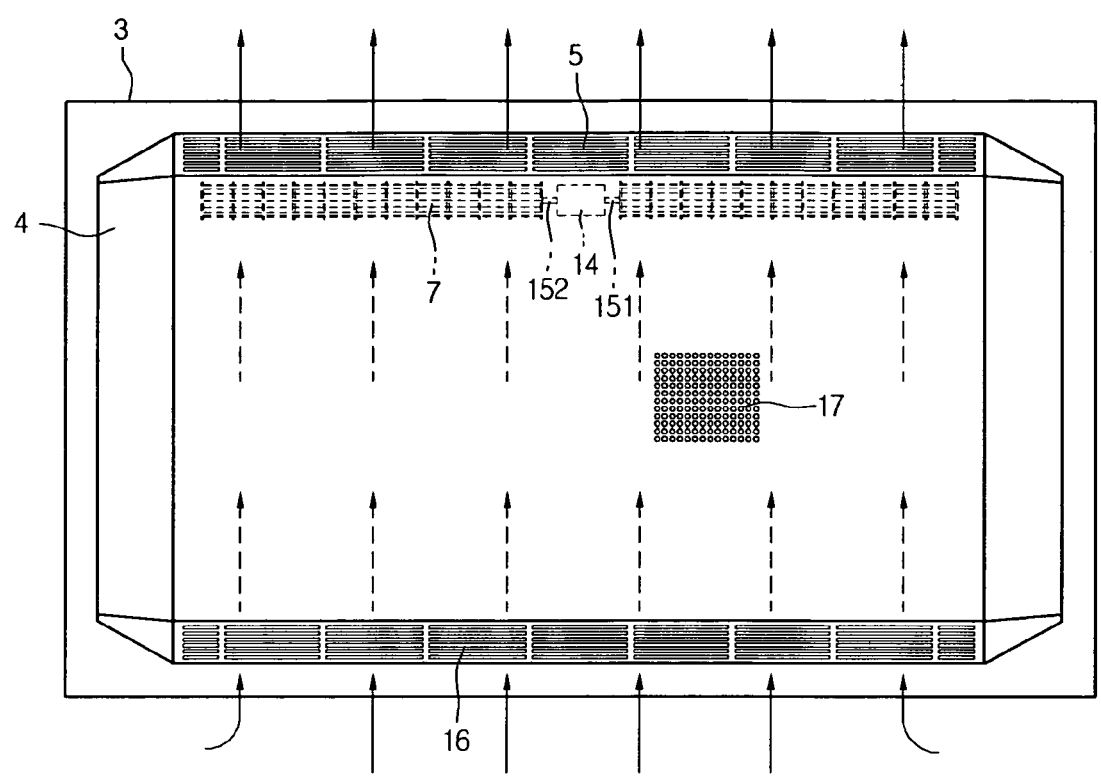
FIG. 11 is a rear view of the flat display device of FIG. 10.

FIG. 11 is a rear view of the flat display device of FIG. 10.

Referring to FIG. 11, the cooling operation of this embodiment is substantially identical to that of FIG. 6 except that the left and right impellers 101 and 102 stably rotate by the motor 14 disposed therebetween.

Fourth Embodiment

Figure 12:
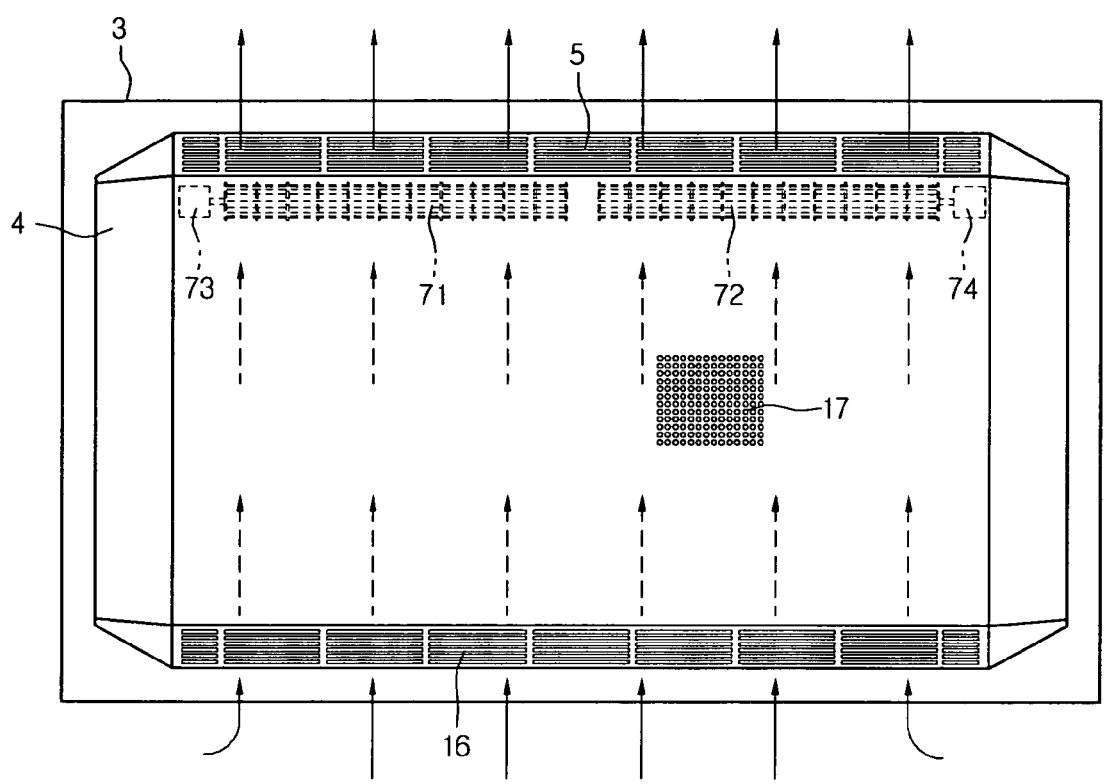
FIG. 12 is a rear view of a flat display device having a cooling apparatus according to another embodiment of the present invention.

FIG. 12 is a rear view of a flat display device having a cooling apparatus according to another embodiment of the present invention. The flat display device of this embodiment is substantially identical to that of FIG. 10 except for the structure of the cross-flow fan. Therefore, only the different portion will be described hereinafter.

Referring to FIG. 12, a cross-flow fan of this embodiment includes first and second cross-flow fans 71 and 72 and first and second motors 73 and 74 rotating respectively the first and second cross-flow fans 71 and 72. The first and second motors 73 and 74 are respectively installed on outer ends of the respective first and second cross-flow fans 71 and 72. At this point, in the cross-flow fan, only the impeller may be separated into two impellers or overall body including the scroll and stabilizer may be separated into two sections.

This embodiment may be applied for a large-sized flat display device. That is, when the size of the flat display device increases the length of the cross-flow fan also increases. In this case, the long cross-flow fan does not effectively operate by a single motor. Therefore, the cross-flow fan is divided into two fans operated by independent motors, respectively.

Fifth Embodiment

Figure 13:
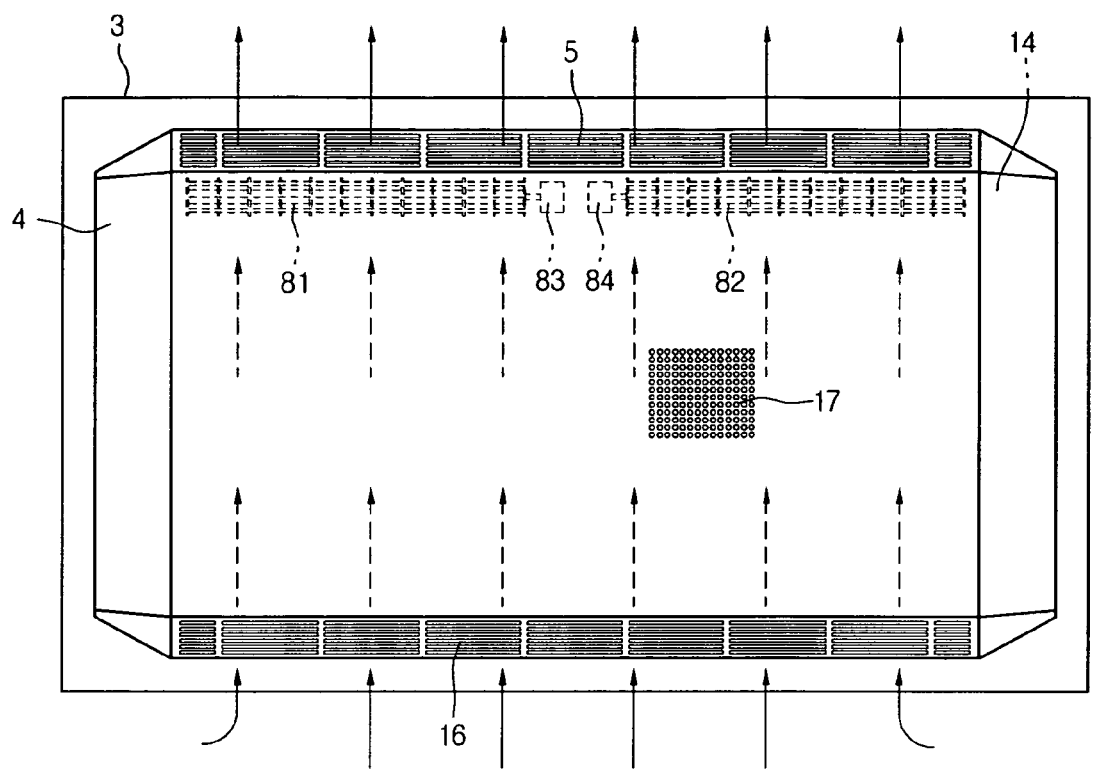
FIG. 13 is a rear view of a flat display device having a cooling apparatus according to another embodiment of the present invention.

FIG. 13 is a rear view of a flat display device having a cooling apparatus according to another embodiment of the present invention. The flat display device of this embodiment is substantially identical to those of FIGS. 10 and 12 except for the structure of the cross-flow fan. Therefore, only the different portion will be described hereinafter.

Referring to FIG. 13, a cross-flow fan of this embodiment includes first and second cross-flow fans 81 and 82 and first and second motors 83 and 84 rotating respectively the first and second cross-flow fans 81 and 82. The first and second motors 83 and 84 are respectively installed on inner ends of the respective first and second cross-flow fans 81 and 82. At this point, in the cross-flow fan, only the impeller may be separated into two impellers or overall body including the scroll and stabilizer may be separated into two sections.

This embodiment may be applied for a large-sized flat display device. That is, when the size of the flat display device increases, the length of the cross-flow fan also increases. In this case, the long cross-flow fan does not effectively operate by a single motor. Therefore, the cross-flow fan is divided into two fans operated by independent motors, respectively. Furthermore, this embodiment could be adapted for cooling the corner portion of the flat display device, differently from the fourth embodiment.

In the above-described above embodiments, although only two cross-flow fans are provided, the present invention is not limited thereto. That is, more than three cross-flow fans can be provided according to the size of the display device.

According to the present invention, since no space for installing the blower fan is required, the flat display device can be designed to be slimmer while providing a sufficient heat dissipation effect.

Furthermore, since the air exhaust outlet is formed in a shape similar to a cross section of the flat display device, the structure is simplified and the airflow noise can be minimized.

Since the internal hot air of the flat display device can be exhausted by a negative pressure generated by the fan as well as by the natural convection, the air circulation can be effectively realized in the display device.

The cooling apparatus can improve a degree of installation free of the display device by improving an airflow direction in the flat display device.

The cooling apparatus of the present invention can enhance strength of a back cover by improving location and structure of holes formed on the back cover.

The cooling apparatus can minimize noise and improve heat dissipation efficiency by allowing internal air of the flat display device to be exhausted by natural convection.

Since the fan can be stably supported, the operational reliability of the fan can be improved and the vibration generated during the rotation of the fan can be reduced.

Even when the cooling load and rotational resistance against the fan is high, the rotation force can be increased in response thereto. Thus, the cooling effect can be realized even at the corners of the flat display device.

When the cross-flow fan is divided into two fans and independent motors are respective provided to the fans, the rotational speed of the cross-flow fans can be controlled in response to the internal thermal load of the flat display device, thereby properly cooling the flat display device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A cooling apparatus for a flat display device, comprising:
a flat display module;
a front cover that protects a front portion of the flat display module;

a back cover for that protects a rear portion of the flat display module;

at least one air inlet formed on a portion of the back cover to allow external air to be introduced into the back cover;

at least one air outlet formed on another portion of the back cover and extending along a longitudinal length of the flat display module;

at least one fan disposed inside the back cover adjacent to the at least one air outlet; and an air outlet channel aligned with the at least one air outlet, wherein the air outlet channel provides an effective exhaust area which is formed to have a length in a lengthwise direction of the flat display module longer than in a thickness direction of the flat display module, and the fan is a cross-flow fan.

2. The cooling apparatus according to claim 1, wherein the air outlet channel has a rectangular section.

3. The cooling apparatus according to claim 1, wherein the air outlet is formed on a peripheral portion of the back cover.

4. The cooling apparatus according to claim 1, wherein the air inlet of the back cover is formed on a peripheral portion and/or rear surface of the back cover.

5. The cooling apparatus of claim 1, wherein the at least one air outlet comprises a plurality of slits provided in the back cover.

6. The cooling apparatus of claim 1, wherein the at least one air inlet and the at least one air outlet are formed on inclined portions of the back cover.

7. The cooling apparatus of claim 1, further comprising a housing for the fan, having the air outlet channel.

8. The cooling apparatus of claim 7, wherein the housing comprises a scroll disposed adjacent one side of the at least one fan and a stabilizer disposed on another side of the at least one fan, wherein the scroll and the stabilizer contact a surface of the back cover which has the air outlet.

9. A cooling apparatus for a flat display device, comprising:
a flat display module;
a cover that receives and protects the flat display module;
an air inlet formed on a back portion of the cover to allow external air to be introduced into the back cover;
an air outlet formed on the back portion of the cover; and
a cross-flow fan disposed inside the cover adjacent to the air outlet, wherein an effective exhaust area of an outlet of the fan is substantially rectangular in shape and formed such that a length in a lengthwise first direction of the flat display module is longer than a length in a thickness second direction of the flat display module.

10. A cooling apparatus for a flat display device, comprising:
a flat display module;
a cover that supports the flat display module;
an air inlet formed on the cover to allow external air to be introduced into the cover;
an air outlet formed on the cover; and
a plurality of fans positioned adjacent to the air outlet and aligned in parallel to exhaust internal hot air generated by the flat display module through the air outlet, wherein each of the plurality of fans is a cross-flow fan.

11. The cooling apparatus according to claim 10, wherein the plurality of cross-flow fans is driven by a single motor disposed at a substantially center portion of the flat display module.

12. The cooling apparatus according to claim 10, wherein the plurality of cross-flow fans is received in a single housing and each cross-flow fan has an impeller, respectively.

13. The cooling apparatus according to claim 10, wherein the plurality of cross-flow fans is driven by independent motors, respectively.

14. The cooling apparatus according to claim 10, wherein the plurality of cross-flow fans extends to reach respective side ends of the flat display module.

15. The cooling apparatus according to claim 10, wherein components that require thermal stability are disposed adjacent to the air inlet.

* * * * *